(12) United States Patent
Iisaka

(10) Patent No.: US 10,285,319 B2
(45) Date of Patent: May 7, 2019

(54) COMPONENT MOUNTING LINE MANAGEMENT DEVICE

(71) Applicant: FUJI CORPORATION, Chiryu (JP)

(72) Inventor: Jun Iisaka, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 361 days.

(21) Appl. No.: 15/030,293

(22) PCT Filed: Oct. 30, 2013

(86) PCT No.: PCT/JP2013/079383
§ 371 (c)(1),
(2) Date: Apr. 18, 2016

(87) PCT Pub. No.: WO2015/063880
PCT Pub. Date: May 7, 2015

(65) Prior Publication Data
US 2016/0255755 A1    Sep. 1, 2016

(51) Int. Cl.
*H05K 13/08* (2006.01)
*H05K 13/04* (2006.01)

(52) U.S. Cl.
CPC ............. *H05K 13/08* (2013.01); *H05K 13/04* (2013.01); *H05K 13/0882* (2018.08)

(58) Field of Classification Search
CPC .......... G06F 19/00; H05K 3/30; H05K 3/301; H05K 3/303; H05K 13/04; H05K 13/08; H05K 13/0882
See application file for complete search history.

(56) References Cited

U.S. PATENT DOCUMENTS 5,325,305 A    6/1994   Rezaei
6,027,019 A    2/2000   Kou
(Continued)

FOREIGN PATENT DOCUMENTS

JP    2003-204190 A    7/2003
JP    2004-47572 A     2/2004
(Continued)

OTHER PUBLICATIONS

International Search Report dated Dec. 17, 2013, in PCT/JP2013/079383 filed Oct. 30, 2013.
(Continued)

*Primary Examiner* — Carl J Arbes
(74) *Attorney, Agent, or Firm* — Oblon, McClelland, Maier & Neustadt, L.L.P.

(57) ABSTRACT

There is provided a component mounting line management device that can determine whether an installation device detachably attached to a component mounting machine is used, when communication between a configuration management device and the component mounting machine is impossible. In the component mounting line management device (1) according to the present invention, each component mounting machine or each installation device includes an installation device information memory device (11). The installation device information memory device (11) stores installation device identification information of the installation device attached at an installation position, and location information on the installation position in correlation with each other. Each component mounting machine includes a communication-abnormal-time installation device determination section (12). When communication with the configuration management device (1H) is impossible, the communication-abnormal-time installation device determination section (12) compares installation device identification
(Continued)

information of the installation device mounted at the installation position and the location information on the installation position, to installation device identification information of the installation device and location information correlated with the installation device identification information, which are stored in the installation device information memory device (11), so as to determine whether the installation device is used.

3 Claims, 9 Drawing Sheets

(56) References Cited

U.S. PATENT DOCUMENTS

| | | | |
|---|---|---|---|
| 6,530,517 B1 | | 3/2003 | Kou |
| 6,634,094 B1 * | | 10/2003 | Morita .................. H05K 13/08 29/739 |
| 7,142,939 B2 * | | 11/2006 | Nonaka ............ G05B 19/41805 700/121 |
| 2007/0168163 A1 | | 7/2007 | Kobayashi |

FOREIGN PATENT DOCUMENTS

| | | |
|---|---|---|
| JP | 2004-87758 A | 3/2004 |
| JP | 2005-236097 A | 9/2005 |
| JP | 2006-108138 A | 4/2006 |
| JP | 2008-60610 A | 3/2008 |
| JP | 2009-64902 A | 3/2009 |
| JP | 2013-201425 A | 10/2013 |

OTHER PUBLICATIONS

Extended European Search Report dated Jul. 7, 2017 in Patent Application No. 13896289.9.

European Office Action dated Mar. 15, 2018 in European Patent Application No. 13 896 289.9.

Combined Office Action and Search Report dated Apr. 26, 2018 in Chinese Patent Application No. 201380080543.2 (with English language translation of the Office Action and English translation of categories of cited documents). 14 pages.

* cited by examiner

FIG. 4

| FEEDER IDENTIFICATION INFORMATION | COMPONENT IDENTIFICATION INFORMATION |
|---|---|
| F 1 | P 1 |
| F 2 | P 2 |
| F 3 | P 3 |
| : | : |

FIG. 5

| PRINTED CIRCUIT BOARD TYPE | COMPONENT MOUNTING MACHINE 21 | COMPONENT MOUNTING MACHINE 22 | COMPONENT MOUNTING MACHINE 27 | COMPONENT MOUNTING MACHINE 28 |
|---|---|---|---|---|
| A | J A 1 | — | J A 7 | J A 8 |
| B | J B 1 | J B 2 | J B 7 | J B 8 |
| C | J C 1 | — | — | J C 8 |
| : | : | : | : | : |

FIG. 6

| COMPONENT IDENTIFICATION INFORMATION | LOCATION INFORMATION (COMPONENT MOUNTING MACHINE NUMBER, SLOT NUMBER) |
|---|---|
| P 1 | 2 1, S 3 |
| P 2 | 2 1, S 2 |
| P 3 | 2 1, S 1 |
| : | : |

| SEQUENCE NUMBER | COMPONENT NUMBER | MOUNTING POSITION (X-AXIS DIRECTION) | MOUNTING POSITION (Y-AXIS DIRECTION) | MOUNTING ANGLE (θ DIRECTION) | COMPONENT TYPE |
|---|---|---|---|---|---|
| 0 0 0 1 | P A 1 | X A 1 | Y A 1 | θ A 1 | P 1 |
| 0 0 0 2 | P A 2 | X A 2 | Y A 2 | θ A 2 | P 2 |
| 0 0 0 3 | P A 3 | X A 3 | Y A 3 | θ A 3 | P 3 |
| : | : | : | : | : | : |

FIG. 8

| PRODUCTION JOB | FEEDER IDENTIFICATION INFORMATION | LOCATION INFORMATION (COMPONENT MOUNTING MACHINE NUMBER, SLOT NUMBER) | USE PERIOD (DATE AND TIME) |
|---|---|---|---|
| JA1 | F1 | 21, S3 | 2013, 10, 01, 09 |
| | F2 | 21, S2 | 2013, 10, 15, 09 |
| | F3 | 21, S1 | 2013, 10, 20, 18 |
| JB1 | F4 | 21, S2 | — |
| | F5 | 21, S1 | — |
| JC1 | F1 | 21, S1 | 2013, 10, 01, 09 |
| | F2 | 21, S3 | 2013, 10, 15, 09 |
| | F3 | 21, S2 | 2013, 10, 20, 18 | under mounting line management device

TECHNICAL FIELD

The present disclosure relates to a component mounting line management device that determines whether using an installation device detachably attached to a component mounting machine is allowed.

BACKGROUND ART

If an installation device is attached on a component mounting machine before the start of production or during production, it is determined whether using the installation device is allowed. Thus, degradation of production quality due to incompatibility of the installation device is prevented. As an example of such a component mounting line management device, the disclosure disclosed in PTL 1 or PTL 2 is exemplified.

In the disclosure disclosed in PTL 1, classification category data including the type or the category of the parts feeder is read from a category data memory section built in a parts feeder which accommodates components. Thus, in the disclosure disclosed in PTL 1, the classification category data which has been read and feeder data indicating the correct classification category are compared to each other so as to determine whether the parts feeder is right.

As disclosed in PTL 2, location data and maintenance management data are recorded in a database. The location data indicates a location of a parts cassette which accommodates components, and includes a storage position of each parts cassette and an installation position in the component mounting machine. The maintenance management data includes history data indicating a history of the parts cassette. As disclosed in PTL 2, every time the parts cassette is moved, the bar code of the parts cassette is read by a portable terminal, and the maintenance management data of the parts cassette is transmitted to the database along with the location data. Thus, as disclosed in PTL 2, the maintenance management data is managed along with the location of the parts cassette.

CITATION LIST

Patent Literature

PTL 1: JP-A-2003-204190
PTL 2: JP-A-2008-60610

SUMMARY

Problem to Solved

In a component mounting line in which a plurality of component mounting machines is arranged, installation device information regarding an installation device is unitarily managed by a configuration management device. If an installation device is attached before the start of production or during production, the configuration management device communicates with the component mounting machine and determines whether using the mounted installation device is allowed. Thus, if the configuration management device determines that the installation device is available, the component mounting machine starts production by using the mounted installation device.

However, if communication between the configuration management device and the component mounting machine is impossible, the configuration management device is not capable of confirming whether using the installation device is allowed, and necessarily suspends production. In the component mounting line, even though communication between one component mounting machine and the configuration management device is impossible, production in the entirety of the component mounting line managed by the configuration management device is suspended. Accordingly, as the number of component mounting machines which are arranged is increased, a period of time when the production is suspended becomes long and production efficiency in the component mounting line is degraded.

Considering such circumstances, an object of the present disclosure is to provide a component mounting line management device which can determine whether using an installation device which is detachably attached to a component mounting machine is allowed, when communication between a configuration management device and the component mounting machine is impossible.

Solution to Problem

According to the present disclosure, there is provided a component mounting line management device which includes a component mounting line, and a configuration management device. In the component mounting line, a plurality of component mounting machines which mount components on a printed circuit board is arranged. The configuration management device is connected to each of the component mounting machines through a communication line, and stores installation device identification information and location information in correlation with each other. The installation device identification information is used for identifying each of a plurality of installation devices, which is detachably attached at an installation position of the component mounting machine, and the location information indicates an installation position of the installation device in the component mounting machine. The configuration management device includes a communication-normal-time installation device determination section. The communication-normal-time installation device determination section receives transmission of the installation device identification information of the installation device and the location information on the installation position when the installation device is attached at the installation position, from the component mounting machine. The communication-normal-time installation device determination section compares the transmitted installation device identification information and the transmitted location information to installation device identification information of the installation device and location information correlated with the installation device identification information, which are stored in the configuration management device, so as to determine whether using the installation device is allowed. Each of the component mounting machines or each of the installation devices includes an installation device information memory device. The installation device information memory device stores the installation device identification information of the installation device attached at the installation position, and the location information on the installation position in correlation with each other. Each of the component mounting machines includes a communication-abnormal-time installation device determination section. When communication with the configuration management device is impossible, the communication-abnormal-time installation device determination section compares the installation device identification information of the installation device attached at the installation position and the location information on the installation position, to installation device identification information of the installation device and location information correlated with the installation device identification information which are stored in the installation device information memory device, so as to determine whether using the installation device is allowed.

In the component mounting line management device according to the present disclosure, each of the component mounting machines or each of the installation devices includes the installation device information memory device, and each of the component mounting machines includes the communication-abnormal-time installation device determination section. Thus, when communication between the configuration management device and the component mounting machine is impossible, the component mounting line management device can determine whether using the installation device is allowed, by using installation device identification information of the installation device and the location information correlated with the installation device identification information, which are stored in the installation device information memory device. Accordingly, the component mounting line can continuously perform production, even when communication between the configuration management device and the component mounting machine is impossible, and it is possible to suppress degradation of production efficiency due to suspension of the component mounting line.

BRIEF DESCRIPTION OF DRAWINGS

FIG. 4 is a diagram illustrating a correspondence example between feeder identification information and component identification information.

FIG. 5 is a diagram illustrating a correspondence example between a printed circuit board type and a production job.

FIG. 6 is a diagram illustrating an example of a production job JA1.

FIG. 8 is a diagram illustrating an example of a production job, feeder identification information, location information, and use period.

DESCRIPTION OF EMBODIMENTS

Hereinafter, embodiments of the present disclosure will be described based on the figures. Common components in the embodiments are denoted by common reference signs, correspond to each other, and thereby omitting repetitive descriptions. Each of the figures is a schematic diagram and dimensions of a substructure are not defined.

First Embodiment

Figure 1:
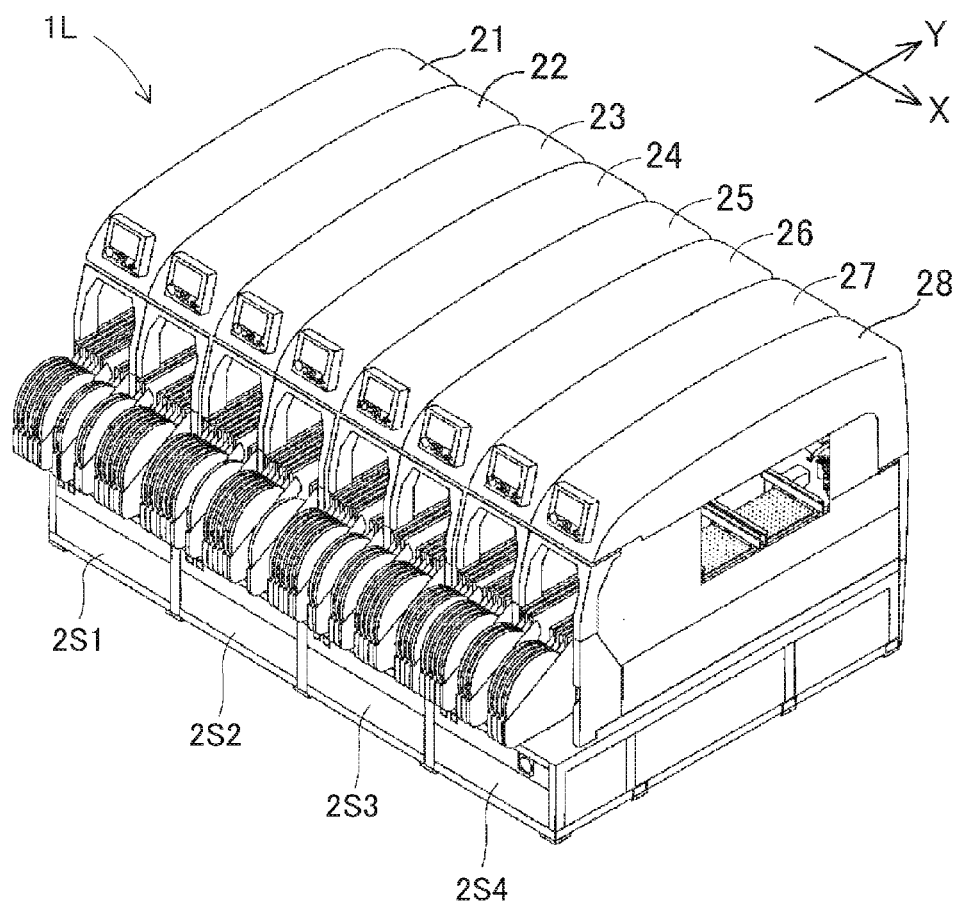
FIG. 1 is a perspective view illustrating an example of the entire configuration of a component mounting line 1D.
Figure 2:
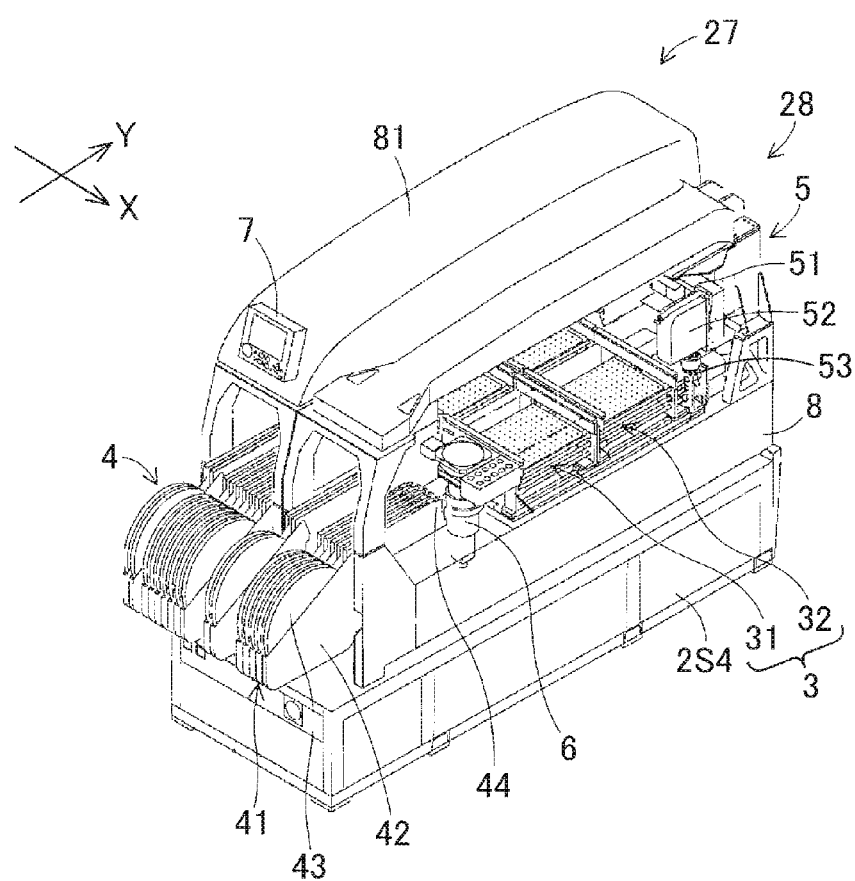
FIG. 2 is a perspective view illustrating component mounting machines 27 and 28 of a system base 2S4 in FIG. 1.

FIG. 1 is a perspective view illustrating an example of the entire configuration of a component mounting line 1L. FIG. 2 is a perspective view illustrating component mounting machines 27 and 28 of a system base 2S4 in FIG. 1. In the component mounting line 1L, system bases 2S1 to 2S4 are arranged in series. In each of the system bases 2S1 to 2S4, two component mounting machines having the same structure are mounted. Thus, in the component mounting line 1L, eight component mounting machines 21 to 28 are arranged in series.

If the component mounting machine 21 on a depth side in the left direction of a surface of paper in FIG. 1 is set as an upstream side, and the component mounting machine 28 on the front side in the right direction of the surface of the paper is set as a downstream side, a printed circuit board is carried in from the component mounting machine 21 on the upstream side and is carried out from the component mounting machine 28 on the downstream side. In the component mounting machines 21 to 28, a component is mounted on a printed circuit board during a period of time when the printed circuit board is conveyed in order of the component mounting machines 21 to 28. In FIG. 1, the conveyance direction of a printed circuit board is set to be an X-axis direction and a direction orthogonal to the X-axis direction in a horizontal plane is set to be a Y-axis direction. A configuration of the component mounting machine will be described below in detail by using the component mounting machine 28 as an example. However, the component mounting machines 21 to 27 have a configuration similar to that of the component mounting machine 28.

As illustrated in FIG. 2, the component mounting machine 28 includes a board conveyance device 3, a component supply device 4, a component transfer device 5, a component camera 6, and a control device 7. These devices are assembled on a base 8. The board conveyance device 3 is arranged in the vicinity of the center in a longitudinal direction (Y-axis direction) of the component mounting machine 28. The board conveyance device 3 is a so-called double-conveyor type conveyance device in which a first conveyance device 31 and a second conveyance device 32 are disposed in parallel.

The first conveyance device 31 includes a pair of guide rails and a pair of conveyor belts. The guide rails are disposed on the base 8 parallel to the X-axis direction. The pair of conveyor belts is used for placing and conveying a printed circuit board guided by the pair of guide rails thereon. A clamping device is provided in the first conveyance device 31. The clamping device is used for pushing the printed circuit board conveyed to amounting position up from the base 8 side, so as to perform positioning. The second conveyance device 32 has a configuration similar to that of the first conveyance device 31.

The component supply device 4 is provided at the front portion (front side in the left direction of the surface of the paper in FIG. 2) of the component mounting machine 28 in the longitudinal direction. A plurality of cassette-type feeders 41 is attached on the main body section so as to be attachable. Each of the feeders 41 corresponds to an installation device of the present disclosure. The feeder 41 includes a feeder main body 42, a supply reel 43, and a component supply section 44. The supply reel 43 is rotatably and detachably attached to the feeder main body 42. The component supply section 44 is provided on a distal end side of the feeder main body 42 (slightly toward the center of the component mounting machine 28). In the first embodiment, the feeder 41 includes a memory 45 which corresponds to a non-volatile memory device, and can store various types of electronic information.

The supply reel 43 is a medium for supplying a component. In the supply reel 43, a carrier tape on which components of the predetermined number are held at a constant interval is wound. A tip end of the carrier tape is drawn up to the component supply section 44, and thus components which are different for each carrier tape are supplied. The feeder 41 may supply a relatively compact component such as a chip component, for example. The component supply device 4 may use, for example, a tray unit as a component accommodation section, in addition to the feeder 41. For example, the tray unit may supply a relatively large-size component such as an IC element and an LSI element, in a state of being accommodated in a tray. The tray unit corresponds to the installation device of the present disclosure.

The component transfer device 5 is a so-called XY robot type transfer device which can move in the X-axis direction and the Y-axis direction. The component transfer device 5 is disposed from the rear portion of the component mounting machine 28 in the longitudinal direction (depth side in the right direction of the surface of the paper in FIG. 2) over the component supply device 4 at the front portion of the component mounting machine 28. The component transfer device 5 includes a head driving mechanism 51 and a component mounting head 52. The component mounting head 52 corresponds to the installation device of the present disclosure.

The head driving mechanism 51 includes an X-axis table and a Y-axis table. The X-axis table is guided by a pair of guide rails which are extended in the X-axis direction. The Y-axis table is guided by a pair of guide rails which are extended in the Y-axis direction. The Y-axis table may be moved in the Y-axis direction by a Y-axis servo motor. The X-axis table is guided on the Y-axis table so as to be able to be moved in the X-axis direction orthogonal to the Y-axis direction. The component mounting head 52 is detachably attached on the X-axis table. The component mounting head 52 may be moved in the X-axis direction and the Y-axis direction by the head driving mechanism 51. In the component mounting machine 28, the first conveyance device 31 and the second conveyance device 32 may carry a printed circuit board in and out, and the component transfer device 5 may mount a component.

A suction nozzle 53 which sucks and holds a component is provided in the component mounting head 52. The suction nozzle 53 causes the component supply section 44 to suck and hold a component, and causes the component to be mounted at a mounting position of the component on a printed circuit board. One suction nozzle 53 or a plurality of suction nozzles 53 may be provided. A plurality of suction nozzles 53 may be arranged on a concentric circumference, or may be arranged on a straight line. The suction nozzle 53 corresponds to the installation device of the present disclosure.

The component camera 6 is arranged on the base 8 between the component supply section 44 and the first conveyance device 31. The component camera 6 may image a plurality of components sucked and held by the suction nozzle 53, at one time. A known image processing device is provided in the component camera 6. An image processing device of the component camera 6 may determine suitability of a component from an image which has been imaged, and may determine a suction state of a component, which includes quality of the component. For example, the image processing device of the component camera 6 may detect a position shift and an angle shift of a component against the suction nozzle 53. A result of detection may be used when the mounting position of a component is corrected.

Figure 3:
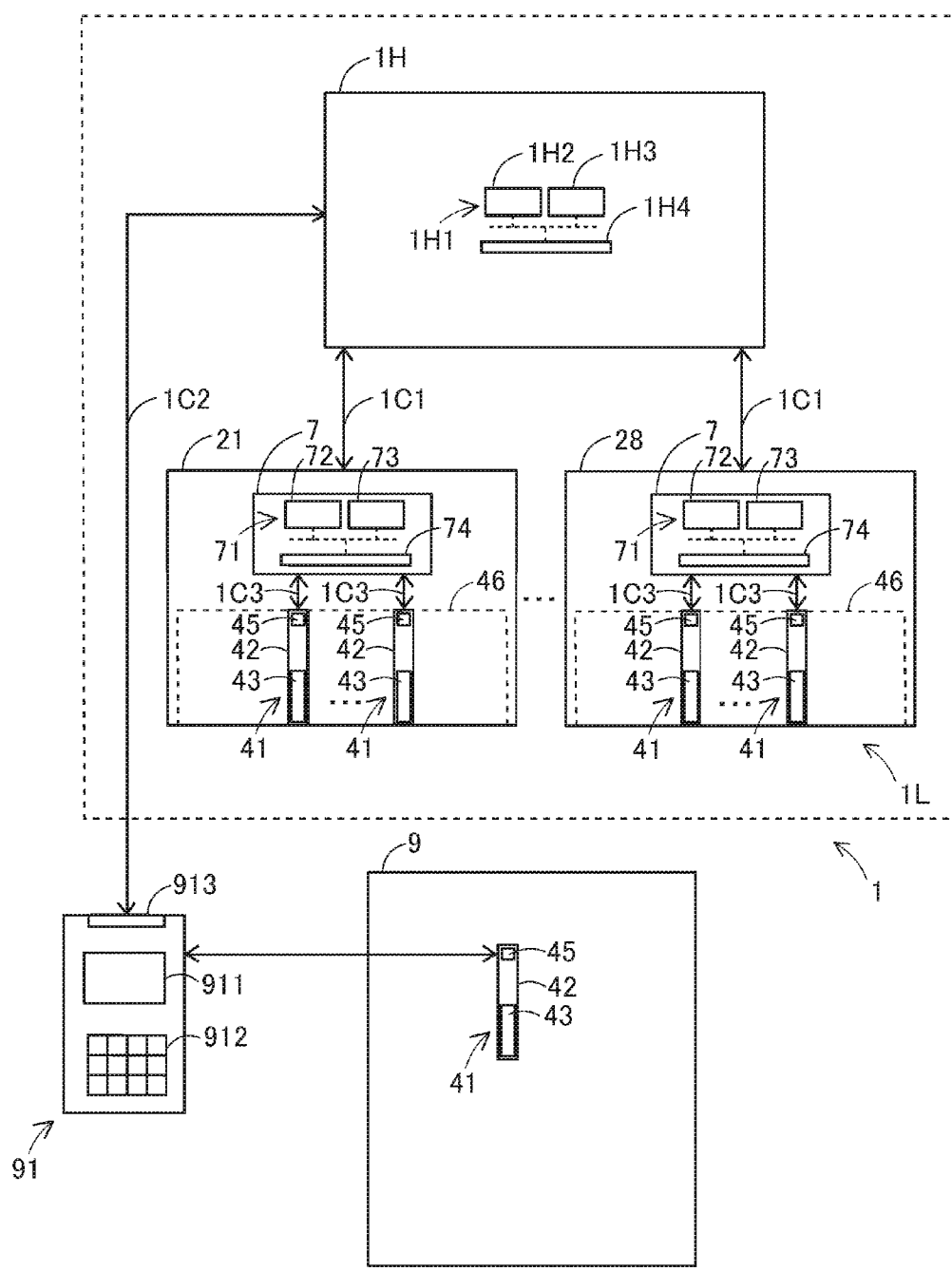
FIG. 3 is a schematic configuration diagram illustrating a connection state between a configuration management device 1H, control devices 7 of the component mounting machines 21 to 28, and a feeder 41.

FIG. 3 is a schematic configuration diagram illustrating a connection state between the configuration management device 1H, control devices 7 of the component mounting machines 21 to 28, and the feeder 41. Each of the control devices 7 is arranged at an upper portion on the front side of a cover 81 illustrated in FIG. 2. As illustrated in FIG. 3, each of the control devices 7 includes a known microcomputer 71. The microcomputer 71 includes a CPU 72, a memory 73, and a communication interface 74.

The CPU 72 is a central processing unit and may perform various computations. The memory 73 is a memory device which is readable and writable, and may store various types of electronic information. The communication interface 74 is an interface that communicates with the configuration management device 1H. For example, a known LAN interface may be used as the communication interface 74. The communication interface 74 may communicate with the installation device.

The configuration management device 1H that controls each of the component mounting machines 21 to 28 is provided in the component mounting line 1L. As illustrated in FIG. 3, the configuration management device 1H includes a known microcomputer 1H1. The microcomputer 1H1 includes a CPU 1H2, a memory 1H3, and a communication interface 1H4. The CPU 1H2 is a central processing unit and may perform various computations. The memory 1H3 is a memory device which is readable and writable, and may store various types of electronic information. The communication interface 1H4 is an interface that communicates with each of the component mounting machines 21 to 28. For example, a known LAN interface may be used as the communication interface 1H4. The communication interface 1H4 may communicate with a terminal device 91.

The configuration management device 1H and the control device 7 of each of the component mounting machines 21 to 28 are connected to each other on a wired or wireless communication line 1C1, so as to enable communication with each other. A communication method is not particularly limited, and an electronic method, a magnetic method, and other various methods may be used. For example, as the communication line 1C1, a LAN (local area network) may be used, and various types of data and various control signals may be transmitted and received through the communication line 1C1. Examples of the various types of data include component information of a component to be mounted on a printed circuit board, component accommodation information thereof, a mounting order of the component, and a mounting position of the component. For example, the various types of data include information regarding the installation device such as the feeder 41, the tray unit, the component mounting head 52, and the suction nozzle 53.

A tool table 9 which is in a workspace is disposed next to the component mounting line 1L. The supply reel 43 may be attached to the feeder 41, on the tool table 9, for example.

A bar code indicating feeder identification information is affixed to the feeder 41. A bar code indicating component identification information is affixed to the supply reel 43. The feeder identification information is identification information for identifying a plurality of the feeders 41. The component identification information is identification information for identifying the component type of a component which is accommodated on the component tape wound by the supply reel 43. The bar codes are read by the terminal device 91. As the terminal device 91, a known bar code reader, a portable information terminal device, or the like which includes a function of reading a bar code may be used. A presentation method of the feeder identification information or the component identification information is not limited to the bar code, and, for example, a known IC tag and the like may be used.

As illustrated in FIG. 3, the terminal device 91 includes a display section 911 such as a liquid crystal display device, an input section 912 such as touch keys, and an optical reading section 913. The terminal device 91 is connected to the configuration management device 1H through a communication line 1C2 which is equivalent to the communication line 1C1, so as to enable communication with the configuration management device 1H. The terminal device 91 may acquire the feeder identification information by causing the reading section 913 to read the bar code of the feeder 41. The terminal device 91 may acquire the component identification information by causing the reading section 913 to read the bar code of the supply reel 43. The feeder identification information and the component identification information which have been acquired are transmitted to the configuration management device 1H through the communication line 1C2, and then are stored in the memory 1H3.

FIG. 4 is a diagram illustrating a correspondence example between the feeder identification information and the component identification information. If the configuration management device 1H receives feeder identification information and component identification information from the terminal device 91, the configuration management device 1H correlates the feeder identification information for identifying the feeder 41 with the component identification information of a component accommodated in the feeder 41, and stores a result of association in the memory 1H3. Thus, the feeder identification information of the feeder 41 and the component identification information of a component accommodated in the feeder 41 are associated with each other. FIG. 4 illustrates that the feeder 41 indicated by feeder identification information F1 accommodates components of a component type indicated by component identification information P1. Other feeders 41 are similar to the above-described feeder.

FIG. 5 is a diagram illustrating a correspondence example between a printed circuit board type and a production job. The configuration management device 1H generates a production job for each printed circuit board type to be produced, based on a production plan. The production job corresponds to a production program used in each of the component mounting machines 21 to 28. FIG. 5 illustrates an example of the production job. For example, in a case where a printed circuit board of a printed circuit board type A is produced, the component mounting machines 21, 27, and 28 are used, but the component mounting machines 22 to 26 are not used. The printed circuit board of the printed circuit board type A is carried into the component mounting machine 21 and has a predetermined component mounted thereon. Then, the printed circuit board of the printed circuit board type A is carried out to the component mounting machines 27 and 28. Similarly, a predetermined component is also mounted on the board in the component mounting machines 27 and 28.

FIG. 5 illustrates a production job JA1 as a production program used when the component mounting machine 21 mounts a component on a printed circuit board, illustrates a production job JA7 as a production program used when the component mounting machine 27 mounts a component on the printed circuit board, and illustrates a production job JA8 as a production program used when the component mounting machine 28 mounts a component on the printed circuit board. Other production jobs are similar to the above-described production jobs. In a case where a plurality of component mounting lines 1L is provided, setting is performed similarly to other component mounting lines 1L, and thus a production job may be generated for each of the component mounting lines 1L. In addition, the production job may be generated by integrating production programs of the plurality of component mounting lines 1L or the plurality of component mounting machines 21 to 28 in a predetermined unit.

FIG. 6 is a diagram illustrating an example of the production job JA1. FIG. 6 illustrates the example of the production job JA1 used when the component mounting machine 21 mounts a component on a printed circuit board during production of a printed circuit board having the printed circuit board type A, and illustrates some of components mounted by the component mounting machine 21 and a portion of a mounting order. For example, in the production job JA1, components of component types indicated by component identification information P1 to P3 are used. As illustrated in FIG. 4, the component of the component type indicated by the component identification information P1 is accommodated in the feeder 41 indicated by the feeder identification information F1. Components of component types indicated by component identification information P2 and P3 are similar to the above-described component.

The configuration management device 1H optimizes the production job so as to cause takt time of the component mounting machines 21 to 28 to be the shortest. The takt time refers to a period of time required in the component mounting machines 21 to 28 when a printed circuit board is produced by mounting a plurality of components on a printed circuit board. A method of optimizing the production job is not limited, but, for example, the configuration management device 1H may optimize the takt time of the component mounting machines 21 to 28 by changing disposition of the feeders 41, the mounting order of components, and the like.

For example, a feeder 41 that accommodates compact components may be disposed in a component mounting machine (component mounting machine 21) on the upstream side, and feeders 41 that accommodates gradually larger-size components may be disposed toward a component mounting machine (component mounting machine 28) on the downstream side. Thus, when the component mounting machine on the downstream side mounts a component on the board, interference with components which have been already mounted can be avoided. Accordingly, it is possible to suppress an increase of a moving distance and a moving period of time due to avoidance of the interference, when the component mounting head 52 picks a component.

In a case where a plurality of components of the same type is mounted, a feeder 41 that accommodates the components may be disposed in a slot 46 which is close to the component camera 6. The component mounting head 52 moves through a path of the component supply section 44, the component camera 6, and the mounting position. Thus, the feeder 41 that accommodates components in order to mount a plurality of components of the same type is disposed in the slot 46 near to the component camera 6, and thus it is possible to reduce the moved distance and the moving period of time when the component mounting head 52 picks a component.

The feeders 41 disposed in the component mounting machines 21 to 28 may be exchanged with each other so as to cause the takt time of each of the component mounting machines 21 to 28 to be equal to each other. For example, a feeder 41 disposed in a component mounting machine having the longest takt time is exchanged with a feeder 41 disposed in a component mounting machine having the shortest takt time. It is possible to equalize takt time of the component mounting machines 21 to 28 by repeating such exchange. Whether the takt time is equal to each other may be determined based on whether a difference between the takt time of the component mounting machines 21 to 28 is in a desired range. Thus, it is possible to avoid an increase of takt time of the entirety of the component mounting line 1L due to occurrence of bottleneck in a specific component mounting machine.

In this manner, for example, a component of the component type indicated by the component identification information P1 is supplied from the feeder 41 indicated by the feeder identification information F1. The feeder 41 is determined to be mounted in the slot 46 having a slot number of S3 in the component mounting machine 21. The configuration management device 1H performs similar operation for components of the component types indicated by the component identification information P2 and P3. Thus, the configuration management device 1H determines feeders 41 and 41 that perform a supply, and slot numbers of S2 and S1 of the slot 46 for mounting the feeders 41 and 41 therein.

As illustrated in FIG. 6, the configuration management device 1H determines the mounting order of components. For example, a component of the component type indicated by the component identification information P1 is mounted at a mounting position corresponding to a component number of PA1, in a sequence number of 0001. The mounting position may be indicated by a mounting position XA1 in the X-axis direction, a mounting position YA1 in the Y-axis direction, and amounting angle θA1 in a θ direction (rotation direction at the mounting position). Processes of a sequence number of 0002 and after are similarly operated.

The control device 7 of each of the component mounting machines 21 to 28 downloads a production job created by the configuration management device 1H, through the communication line 1C1. Each of the component mounting machines 21 to 28 may mount a component in accordance with a production job assigned to the component mounting machine itself, and thus may mount components cooperatively with other component mounting machines.

Each of the component mounting machines 21 to 28 drives the board conveyance device 3, the component supply device 4, the component transfer device 5, and the component camera 6 based on a production job, and thus causes a component to be mounted on a printed circuit board. Specifically, the component mounting head 52 of the component transfer device 5 is moved to the component supply device 4, and sucks and holds a component, based on the production job. The component mounting head 52 is moved to an imaging section of the component camera 6, and the component camera 6 images the component which is sucked and held by the suction nozzle 53.

The component camera 6 detects a position shift and an angle shift of a component against the suction nozzle 53, and corrects a mounting position of the component. The component mounting head 52 rotates the suction nozzle 53 as much as the detected angle shift, so as to correct a mounting angle of the component. The component mounting head 52 is moved to the mounting position of the component on the printed circuit board which is carried in and positioned at the mounting position by the board conveyance device 3. The component mounting head 52 mounts the component on the board, and returns to the component supply device 4. In the component mounting line 1L, each of the component mounting machines 21 to 28 repeats a series of operations, and thus a plurality of components may be mounted on the printed circuit board.

Figure 7:
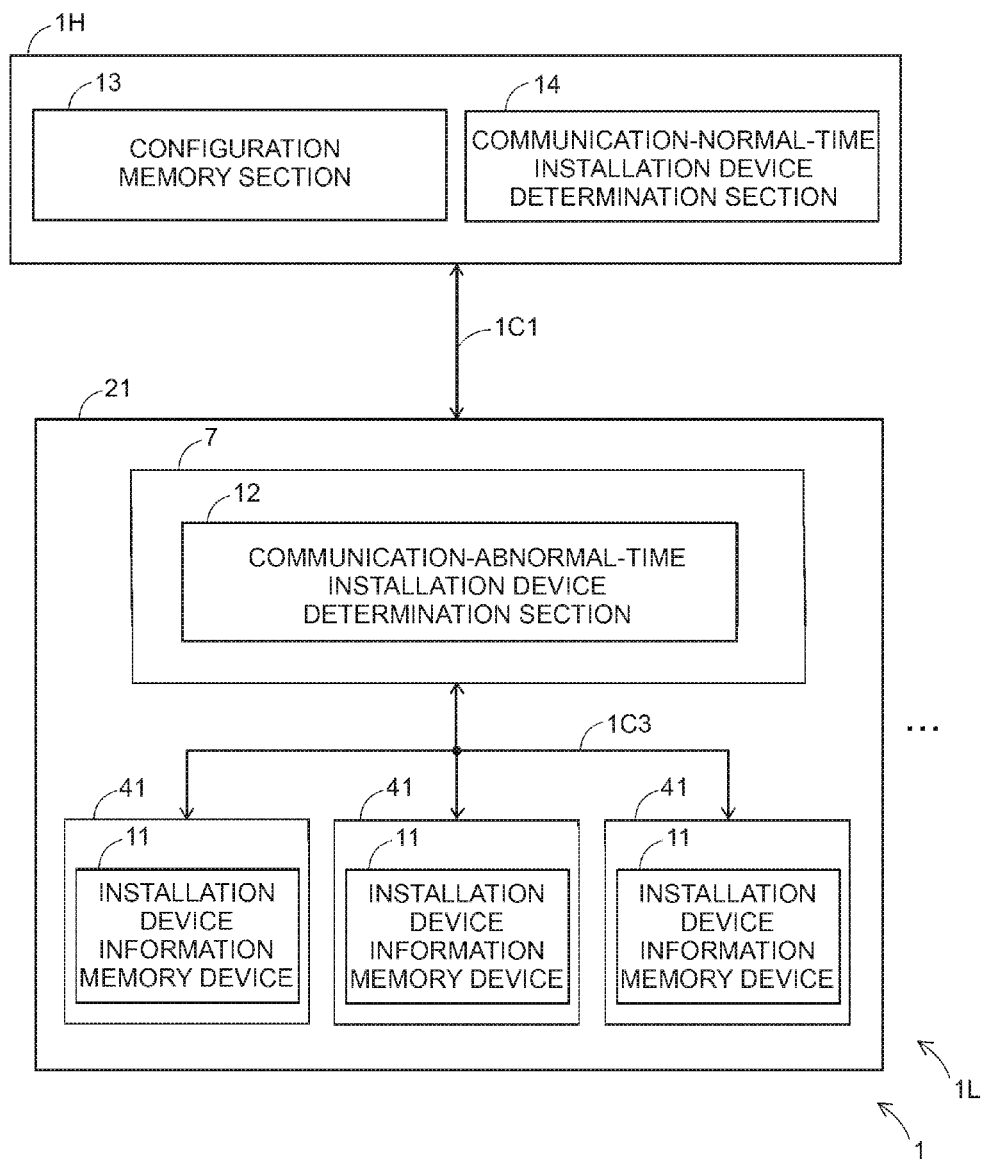
FIG. 7 is a block diagram illustrating an example of a control block of a component mounting line management device 1.

FIG. 7 is a block diagram illustrating an example of the control block of the component mounting line management device 1. As illustrated in FIG. 7, the component mounting line management device 1 includes the component mounting line 1L and the configuration management device 1H. FIG. 7 illustrates only the component mounting machine 21 in the component mounting line 1L. However, each of the component mounting machines 22 to 28 includes a similar configuration.

If recognition as the control block is performed, each of the installation devices (in FIG. 7, feeders 41, 41, and 41) includes an installation device information memory device 11. Each of the component mounting machines 21 to 28 includes a communication-abnormal-time installation device determination section 12. When communication between the configuration management device 1H and each of the component mounting machines 21 to 28 is impossible, the communication-abnormal-time installation device determination section 12 determines whether using the installation device is allowed.

The installation device information memory device 11 stores installation device identification information and location information of each of the installation devices, which are correlated with each other. The installation device identification information refers to identification information for identifying a plurality of installation devices which are detachably attached at installation positions of the component mounting machines 21 to 28. In the present description, an example of using the feeder 41 as the installation device is described. However, the installation device is not limited to the feeder 41. The installation device indicates various devices which include the tray unit, the component mounting head 52, and the suction nozzle 53, which are detachably attached at the installation positions of the component mounting machines 21 to 28. The feeder identification information corresponds to the installation device identification information.

The location information indicates an installation position of the installation device in each of the component mounting machines 21 to 28. For example, an installation position of the feeder 41 in the component mounting machine 21 may be indicated by the slot number of the slot 46 in which the feeder 41 is attached. Thus, the location information of the feeder 41 may be indicated by an identification number of each of the component mounting machines 21 to 28 having the feeder 41 attached therein, and the slot number of the slot 46 in which the feeder 41 is attached. In a case where a plurality of component mounting lines 1L is arranged, a line number for identifying the component mounting line 1L is granted.

The installation device information memory device 11 is appropriate for storing installation device identification information of an installation device attached at an installation position and location information on the installation position, which are correlated with each other, for each of production jobs of the component mounting machines 21 to 28. If the production jobs are different, installation positions in the component mounting machines 21 to 28 may be different even though the same installation device is used. It is possible to correspond to a plurality of production jobs used in, for example, a case where plural types of printed circuit boards are produced, by storing the installation device identification information of the installation device mounted at the installation position and the location information on the installation position, which are correlated with each other, for each of the production jobs.

The installation device information memory device 11 is appropriate for storing a use period of an installation device usable for producing a printed circuit board and the installation device identification information which are correlated with each other. For example, the installation device information memory device 11 may store the use period of a feeder 41 in correlation with the feeder identification information. For example, management of the humidity of a mounted component may be required. In this case, the installation device information memory device 11 stores the use period of a feeder 41 which accommodates the component. The communication-abnormal-time installation device determination section 12 determines that using the feeder 41 the use period of which has elapsed is not allowed. The component in the feeder 41 is not used in mounting, and thus it is possible to improve production quality of a printed circuit board. The above descriptions are similarly applied to the tray unit.

The installation device information memory device 11 may store the use period of the component mounting head 52 in correlation with the identification information of the component mounting head 52. The use period of the component mounting head 52 may be set based on the number of times of performing mounting by using the component mounting head 52, mounting efficiency, and the like. The mounting efficiency is a ratio of correct mounting to the number of times of mounting. Thus, the communication-abnormal-time installation device determination section 12 determines that using the component mounting head 52 the use period of which has elapsed is not allowed, and an operator performs maintenance of the component mounting head 52. Thus, it is possible to manage maintenance of the component mounting head 52 at an appropriate timing, and to ensure reliability of the component mounting head 52. The above descriptions are similarly applied to the suction nozzle 53.

FIG. 8 is a diagram illustrating an example of the production job, the feeder identification information, the location information, and the use period. FIG. 8 illustrates an example of the feeder identification information, the location information, and the use period for each of production jobs JA1 to JC1 of the component mounting machine 21. The location information is indicated by an identification number (in this case, 21) of each of the component mounting machines 21 to 28 having the feeder 41 attached therein, and the slot number (in this case, S1 to S3) of the slot 46 in which the feeder 41 is attached. The use period (date and time) is indicated in an order of a year, a month, a day, and a point of time. For example, a feeder 41 which is used for the production job JA1 and is indicated by the feeder identification information F1 indicates that the feeder 41 is attached in the slot 46 having a slot number of S3 in the component mounting machine 21, and is usable until 2013.10.01, 9 A.M. In a case where the use period is not set in the feeder 41, indication using a mark of "-" is performed.

In the embodiment, the installation device information memory device 11 is provided in the memory 45 of the feeder 41 which corresponds to the installation device. The installation device information memory device 11 stores information regarding this feeder 41 among pieces of information illustrated in FIG. 8. For example, information indicated by the feeder identification information F1 among pieces of information illustrated in FIG. 8 is stored in a feeder indicated by the feeder identification information F1. Other feeders 41 are similar to the above-described feeder.

If the feeder identification information of a feeder 41 and the component identification information of a component accommodated in the feeder 41 are associated with each other, the configuration management device 1H generates production jobs JA1 to JC1, in the tool table 9 illustrated in FIG. 3. The configuration management device 1H transmits information illustrated in FIG. 8 to the terminal device 91 through the communication line 1C2. The received information is written in the installation device information memory device 11 (in the embodiment, memory 45 of the feeder 41) by a known writing device. The information is stored in the installation device information memory device 11.

For example, in the production job JA1, a feeder 41 indicated by the feeder identification information F1 is attached in the slot 46 having a slot number of S3 in the component mounting machine 21. In the production job JB1, a feeder 41 indicated by the feeder identification information F1 is not described and the feeder 41 is not used. In the production job JC1, a feeder 41 indicated by the feeder identification information F1 is attached in a slot 46 having a slot number of S1 in the component mounting machine 21. Such information is written in the memory 45 of the feeder 41 indicated by the feeder identification information F1. The above descriptions are similarly applied to other feeders 41 or the use period (date and time) thereof.

In this manner, before a feeder 41 is attached in the slot 46 of the component mounting machine 21, the feeder 41 may recognize an attachment destination (slot numbers S1 to S3). Thus, for example, a display section such as a liquid crystal display may be provided in the feeder 41 and the slot numbers S1 to S3 for attaching the feeder may be displayed on the display section. Accordingly, the feeder 41 may inform an operator of an attachment destination of the feeder 41.

If an installation device is attached before the start of production or during production, determination of whether using the attached installation device is allowed is required. The communication-abnormal-time installation device determination section 12 determines whether using the installation device is allowed, when communication between the configuration management device 1H and each of the component mounting machines 21 to 28 is impossible.

The communication-abnormal-time installation device determination section 12 compares installation device identification information of an installation device attached at an installation position in each of the component mounting machines 21 to 28, and location information on the installation position to the installation device identification information of the installation device and the location information which are stored in the installation device information memory device 11 and are correlated with each other, and thereby determines whether using the attached installation device is allowed.

For example, a feeder 41 which is used in the production job JA1 and is indicated by the feeder identification information F1 will be described. If a feeder 41 prepared on the tool table 9 is attached in the slot 46 by an operator, the communication-abnormal-time installation device determination section 12 acquires installation device identification information (feeder identification information) and location information of the attached feeder 41. The slot 46 is connected to the control device 7 through the communication line 1C3 which is equal to the communication lines 1C1 and 1C2, so as to enable communication. The installation device identification information (feeder identification information) and the location information of the feeder 41 when the feeder 41 is attached in the slot 46 are transmitted to the control device 7.

The communication-abnormal-time installation device determination section 12 reads the installation device identification information (feeder identification information) and the location information of the feeder 41, which are stored in the installation device information memory device 11 and are correlated with each other. In this case, the feeder identification information F1 is read from the installation device information memory device 11 as the installation device identification information, and the slot number S3 of the component mounting machine 21 is read from the installation device information memory device 11 as the correlated location information.

Figure 9:
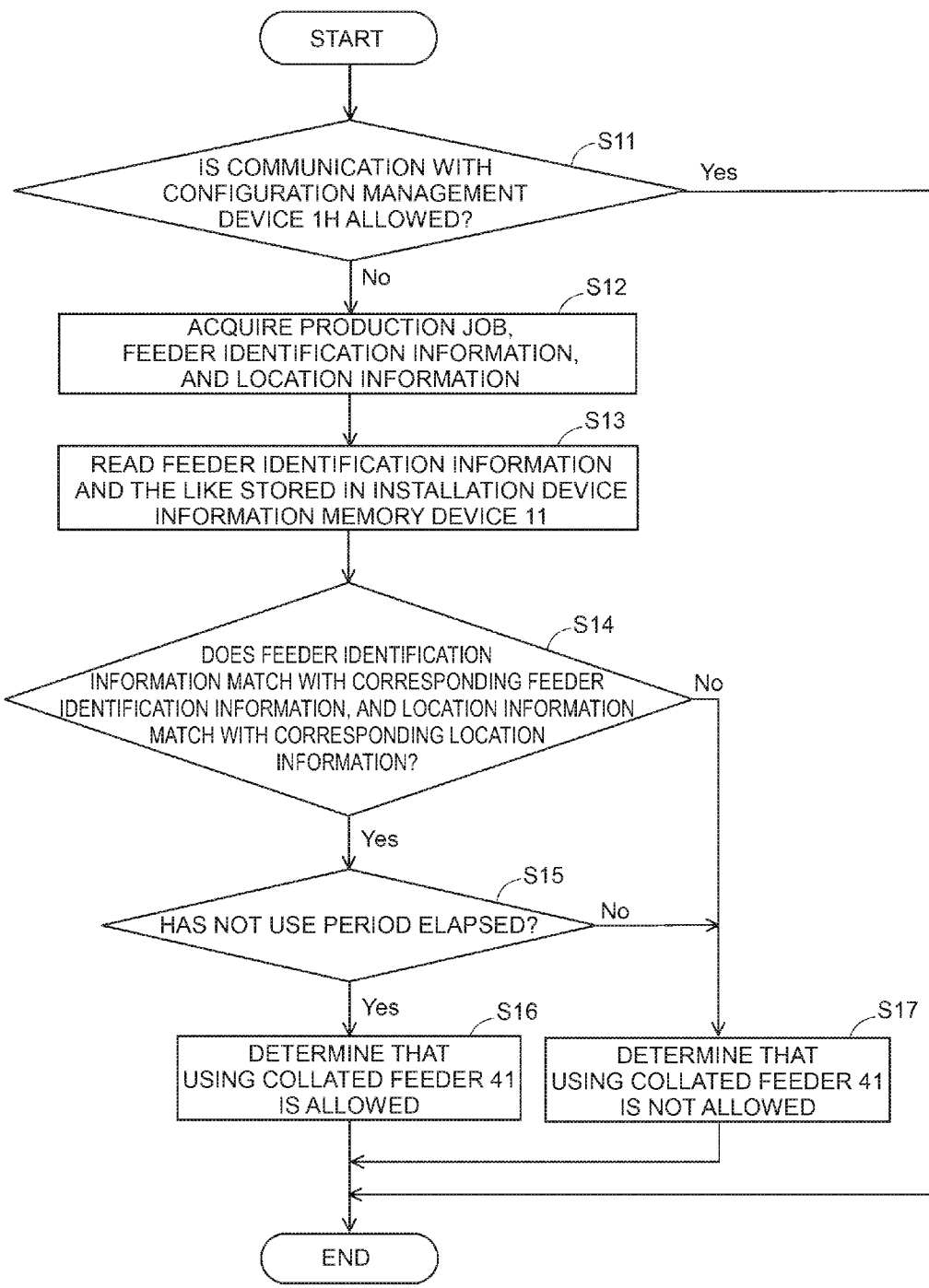
FIG. 9 is a flowchart illustrating an example of procedures for causing a communication-abnormal-time installation device determination section 12 to determine whether using the feeder 41 is allowed.

The communication-abnormal-time installation device determination section 12 compares both pieces of installation device identification information (feeder identification information) to each other, and compares both pieces of location information to each other, so as to determine whether using the feeder 41 is allowed. FIG. 9 is a flowchart illustrating an example of procedures for causing the communication-abnormal-time installation device determination section 12 to determine whether using the feeder 41 is allowed. The communication-abnormal-time installation device determination section 12 has a form of a program. The communication-abnormal-time installation device determination section 12 is stored in the memory 73 and is read from the memory 73 before the start of the production. The communication-abnormal-time installation device determination section 12 executes a program in accordance with a flow illustrated in FIG. 9 and determines whether using the feeder 41 is allowed.

First, the communication-abnormal-time installation device determination section 12 confirms whether communication between the configuration management device 1H and the component mounting machine 21 is allowed (Step S11). In a case where the communication between the configuration management device 1H and the component mounting machine 21 is allowed (case of Yes), the routine is temporarily ended. In this case, the communication-normal-time installation device determination section 14 (which will be described later) determines whether using the feeder 41 is allowed.

In a case where the communication between the configuration management device 1H and the component mounting machine 21 is impossible (case of No), the process proceeds to Step S12. The communication-abnormal-time installation device determination section 12 acquires the name (in this case, production job JA1) of a production job in the process of being performed. The communication-abnormal-time installation device determination section 12 acquires installation device identification information (feeder identification information) and location information of a feeder 41 attached in the slot 46 of the component mounting machine 21 (Step S12).

Subsequently, the communication-abnormal-time installation device determination section 12 reads the installation device identification information (feeder identification information), the location information, and the use period of the feeder 41, which are stored in the installation device information memory device 11 corresponding to the production job JA1 (Step S13). The installation device identification information and the location information are correlated with each other. In this case, the feeder identification information F1, the location information (slot number S3 of the component mounting machine 21) correlated with the feeder identification information F1, and the use period (2013.10.01, 9 A.M.) correlated with the feeder identification information F1 are read from the installation device information memory device 11. The processes of Step S12 and Step S13 may be performed in order of Step S13 and Step S12.

The communication-abnormal-time installation device determination section 12 compares the installation device identification information (feeder identification information) and the location information of the feeder 41, which have been acquired, to the installation device identification information (feeder identification information) and the location information of the feeder 41, which have been read from the installation device information memory device 11 and are correlated with each other (Step S14). In a case where the pieces of installation device identification information (feeder identification information) of the feeder 41 match with each other, and the pieces of location information of the feeder 41 match with each other (case of Yes), the process proceeds to Step S15. In a case where the pieces of installation device identification information (feeder identification information) of the feeder 41 do not match with each other, and the pieces of location information of the feeder 41 do not match with each other (case of No), the process proceeds to Step S17.

In Step S15, the communication-abnormal-time installation device determination section 12 determines whether the use period of the feeder 41 has elapsed. In a case where the use period of the feeder 41 has not elapsed (case of No), the process proceeds to Step S16. In a case where the use period of the feeder 41 has elapsed (case of Yes), the process proceeds to Step S17.

In Step S16, the communication-abnormal-time installation device determination section 12 determines that using the feeder 41 which has been collated is allowed. In Step S17, the communication-abnormal-time installation device determination section 12 determines that using the feeder 41 which has been collated is not allowed. Thus, the routine is temporarily ended. The routine is repeated at a predetermined interval. In a case where a feeder 41 is attached during production, the communication-abnormal-time installation device determination section 12 may appropriately determine whether using the attached feeder 41 is allowed.

In the embodiment, in the component mounting line management device 1, each feeder 41 (corresponding to the installation device of the present disclosure) includes the installation device information memory device 11, and each of the component mounting machines 21 to 28 includes the communication-abnormal-time installation device determination section 12. Thus, the component mounting line management device 1 may determine whether using the feeder 41 is allowed, by using feeder identification information (corresponding to the installation device identification information of the present disclosure) of the feeder 41, and the location information correlated with the feeder identification information, which are stored in the installation device information memory device 11, when the communication between the configuration management device 1H and each of the component mounting machines 21 to 28 is impossible. Accordingly, the component mounting line 1L can continuously perform production even when the communication between the configuration management device 1H and each of the component mounting machines 21 to 28 is impossible, and it is possible to suppress degradation of production efficiency due to suspension of the component mounting line 1L.

As illustrated in FIG. 8, a feeder 41 indicated by the feeder identification information F1 is attached in the slot 46 of the component mounting machine 21, which has a slot number of S3, in the production job JA1. In the production job JC1, the feeder 41 indicated by the feeder identification information F1 is attached in the slot 46 of the component mounting machine 21, which has a slot number of S1. Thus, in a case where the installation device identification information (feeder identification information) and the location information of the feeder 41 are not stored in correlation with each other, for each of the production jobs JA1 to JC1, the attachment destination of the feeder 41 is not settled. Other feeders 41 are similar to the above-described feeder.

In the embodiment, the installation device information memory device 11 stores installation device identification information (feeder identification information) of a feeder 41 (corresponding to the installation device of the present disclosure) attached in a slot 46 (corresponding to the installation position of the present disclosure), and the location information of the slot 46 in correlation with each other, for each of production jobs of the component mounting machines 21 to 28. The communication-abnormal-time installation device determination section 12 determines whether using the feeder 41 is allowed, by using the installation device identification information (feeder identification information) and the location information of the feeder 41, which correspond to a production job in the process of being performed, are stored in the installation device information memory device 11, and are correlated with each other, when communication is impossible.

For example, it is assumed that the communication between the configuration management device 1H and the component mounting machine 21 is impossible during a period of time when the production job JA1 is performed in the component mounting machine 21. At this time, the communication-abnormal-time installation device determination section 12 reads location information stored in the installation device information memory device 11, based on the correlation illustrated in FIG. 8. In this case, the communication-abnormal-time installation device determination section 12 determines whether using the feeder 41 is allowed, by using the component mounting machine 21 and the slot number S3 as the location information of the feeder 41, which is indicated by the feeder identification information F1. The above descriptions are similarly applied to other feeders 41 and similarly applied to the use period of the feeder 41.

Thus, in the component mounting line 1L in which a plurality of production jobs is performed, when the communication between the configuration management device 1H and each of the component mounting machines 21 to 28 is impossible, it is possible to determine whether using a feeder 41 is allowed. Particularly, the communication-abnormal-time installation device determination section 12 can determine whether using the feeder 41 is allowed, based on the production job JA1 in the process of being performed when the communication is impossible. Thus, the component mounting line 1L can start production from the production job JA1 in the process of being performed, even when the communication between the configuration management device 1H and each of the component mounting machines 21 to 28 is impossible.

In the embodiment, the installation device information memory device 11 stores the use period of a feeder 41 (corresponding to the installation device of the present disclosure) which is usable for production of a printed circuit board in correlation with the installation device identification information (feeder identification information). The communication-abnormal-time installation device determination section 12 determines that using the feeder 41 the use period of which has elapsed is not allowed. Thus, in the component mounting line management device 1, it is possible to easily manage quality of a mounted component and to improve production quality of a printed circuit board. In addition, in the component mounting line management device 1, it is possible to manage maintenance of the installation device at an appropriate timing, and to ensure reliability of the installation device.

If the installation device information memory device 11 is provided in each of the component mounting machines 21 to 28, the installation device identification information of the installation device and the location information which are correlated with each other are transmitted to the control device 7 of each of the component mounting machines 21 to 28 through the communication line 1C1. Thus, these pieces of information are stored in the memory 73. In this case, when the communication between the configuration management device 1H and each of the component mounting machines 21 to 28 is impossible, it is difficult to store the installation device identification information and the location information of the installation device in correlation with each other, in the installation device information memory device 11.

In the embodiment, the installation device information memory device 11 is provided in a feeder 41 (corresponding to the installation device of the present disclosure). Thus, even when the communication between the configuration management device 1H and each of the component mounting machines 21 to 28 is impossible, the component mounting line management device 1 can store the installation device identification information (feeder identification information) and the location information of the feeder 41, which are correlated with each other, in the installation device information memory device 11.

If recognition as the control block is performed, the configuration management device 1H includes a configuration memory section 13 and the communication-normal-time installation device determination section 14. When the communication between the configuration management device 1H and each of the component mounting machines 21 to 28 is possible, the communication-normal-time installation device determination section 14 determines whether using the installation device is allowed.

The configuration memory section 13 has a configuration corresponding to that of the installation device information memory device 11. The communication-normal-time installation device determination section 14 has a configuration corresponding to that of the communication-abnormal-time installation device determination section 12. In the present description, descriptions will be made focusing on a difference from the installation device information memory device 11 and the communication-abnormal-time installation device determination section 12. Descriptions for the common configuration, the common actions, and the common effects will be omitted.

The configuration memory section 13 stores installation device identification information (feeder identification information) for identifying each of a plurality of feeders 41 (corresponding to the installation device of the present disclosure) detachably attached at installation positions of the component mounting machines 21 to 28, and location information indicating the installation position of the feeder 41 in each of the component mounting machines 21 to 28, in correlation with each other. For example, the configuration memory section 13 may be provided in the memory 1H3 and may constitute a database.

If a feeder 41 is attached before the start of production or during production, installation device identification information (feeder identification information) of the feeder 41 and location information of the slot 46 when the feeder 41 is attached at a slot 46 (corresponding to the installation position of the present disclosure) are transmitted to the configuration management device 1H from the component mounting machine. For example, if a feeder 41 is attached in the component mounting machine 21 in the process of performing the production job JA1, installation device identification information (feeder identification information) and location information of the attached feeder 41 are transmitted to the configuration management device 1H from the component mounting machine 21.

The communication-normal-time installation device determination section 14 compares the installation device identification information (feeder identification information) and the location information which have been transmitted, to the installation device identification information (feeder identification information) and the location information of the feeder 41, which are stored in the configuration management device 1H (configuration memory section 13 in the embodiment) and are correlated with each other, so as to determine whether using the feeder 41 is allowed.

For example, a feeder 41 which is used in the production job JA1 and is indicated by the feeder identification information F1 will be described. The communication-normal-time installation device determination section 14 reads installation device identification information (feeder identification information) and location information of the feeder 41, which are stored in the configuration memory section 13 and are correlated with each other. In this case, the feeder identification information F1 is read from the configuration memory section 13 as the installation device identification information, and the slot number S3 of the component mounting machine 21 is read from the configuration memory section 13 as the location information.

Figure 10:
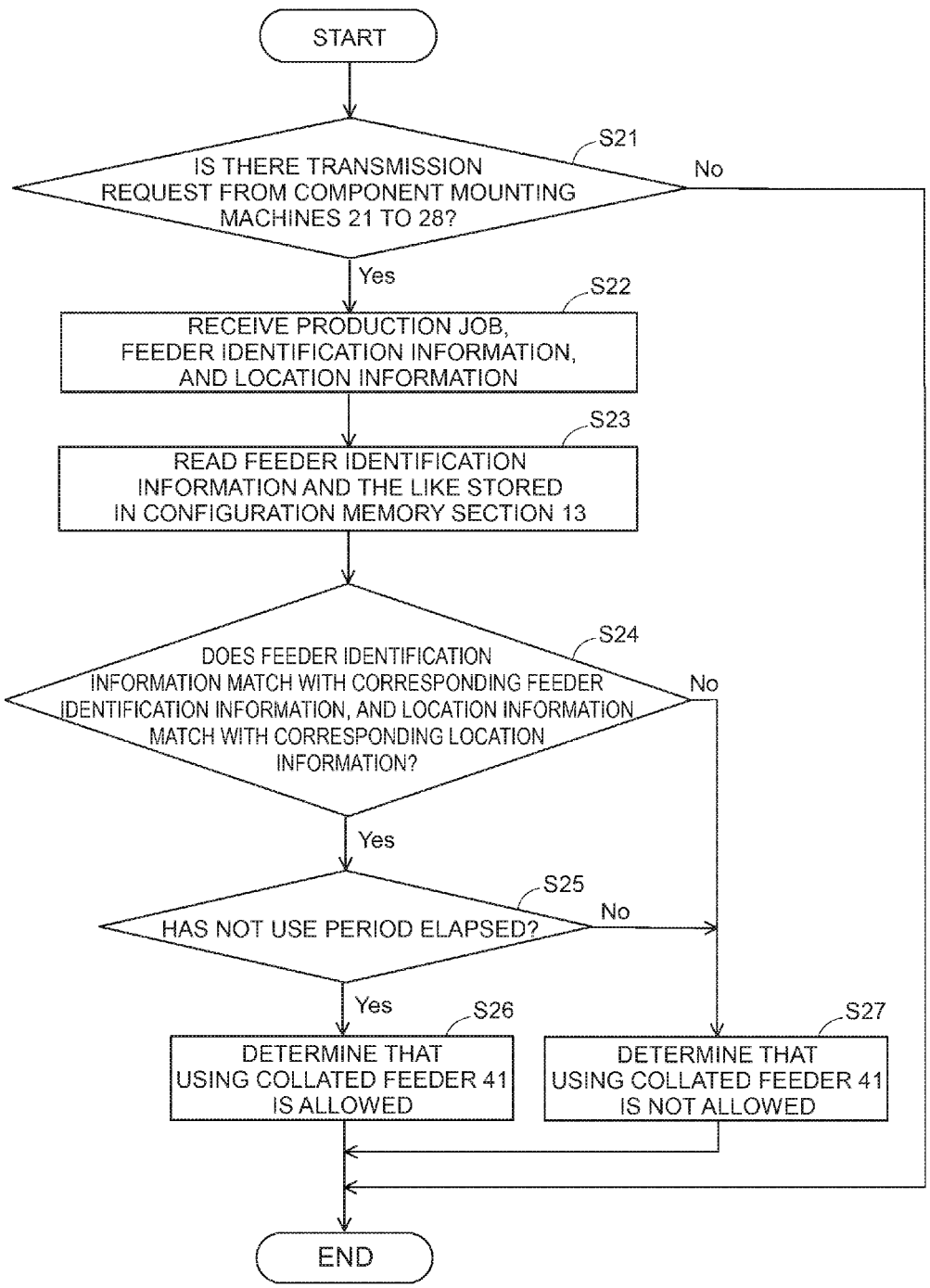
FIG. 10 is a flowchart illustrating an example of procedures for causing a communication-normal-time installation device determination section 14 to determine whether using the feeder 41 is allowed.

The communication-normal-time installation device determination section 14 compares both pieces of installation device identification information (feeder identification information) to each other, and compares both pieces of location information to each other, so as to determine whether using the feeder 41 is allowed. FIG. 10 is a flowchart illustrating an example of procedures for causing the communication-normal-time installation device determination section 14 to determine whether using a feeder 41 is allowed. The communication-normal-time installation device determination section 14 has a form of a program. The communication-normal-time installation device determination section 14 is stored in the memory 1H3 and is read from the memory 1H3 before the start of the production. The communication-normal-time installation device determination section 14 executes a program in accordance with a flow illustrated in FIG. 10, and thus determines whether using the feeder 41 is allowed.

First, the communication-normal-time installation device determination section 14 confirms whether there is a transmission request of installation device identification information (feeder identification information) and location information of the feeder 41 from the component mounting machines 21 to 28 (Step S21). In a case where there is the transmission request from the component mounting machines 21 to 28 (case of Yes), the installation device identification information (feeder identification information) and the location information of the feeder 41 are received from the component mounting machines 21 to 28 (Step S22). At this time, the communication-normal-time installation device determination section 14 receives the name (for example, production job JA1) of a production job in the process of being performed together. In a case where there is no transmission request from the component mounting machine 21 to 28 (case of No), the routine is temporarily ended.

Subsequently, the communication-normal-time installation device determination section 14 reads the installation device identification information (feeder identification information), the location information, and the use period of the feeder 41, which are stored in the configuration memory section 13 corresponding to the production job JA1 (Step S23). The installation device identification information and the location information are correlated with each other. The processes of Step S22 and Step S23 may be performed in order of Step S23 and Step S22. The communication-normal-time installation device determination section 14 compares the installation device identification information (feeder identification information) and the location information of the feeder 41, which are transmitted from the component mounting machines 21 to 28, to the installation device identification information (feeder identification information) and the location information of the feeder 41, which have been read from the configuration memory section 13 and are correlated with each other (Step S24).

In a case where the pieces of installation device identification information (feeder identification information) of the feeder 41 match with each other, and the pieces of location information of the feeder 41 match with each other (case of Yes), the process proceeds to Step S25. In a case where the pieces of installation device identification information (feeder identification information) of the feeder 41 do not match with each other, and the pieces of location information of the feeder 41 do not match with each other (case of No), the process proceeds to Step S27. In Step S25, the communication-normal-time installation device determination section 14 determines whether the use period of the feeder 41 has elapsed. In a case where the use period of the feeder 41 has not elapsed (case of No), the process proceeds to Step S26. In a case where the use period of the feeder 41 has elapsed (case of Yes), the process proceeds to Step S27.

In Step S26, the communication-normal-time installation device determination section 14 determines that using the feeder 41 which has been collated is allowed. In Step S27, the communication-normal-time installation device determination section 14 determines that using the feeder 41 which has been collated is not allowed. Thus, the routine is temporarily ended. The routine is repeated at a predetermined interval. In a case where a feeder 41 is attached during production, the communication-normal-time installation device determination section 14 may appropriately determine whether using the attached feeder 41 is allowed.

In the embodiment, in the component mounting line management device 1, the configuration management device 1H includes the configuration memory section 13 and the communication-normal-time installation device determination section 14. Thus, when the communication between the configuration management device 1H and each of the component mounting machines 21 to 28 is possible, the communication-normal-time installation device determination section 14 may determine whether using the feeder 41 is allowed. In the component mounting line management device 1, the communication-abnormal-time installation device determination section 12 or the communication-normal-time installation device determination section 14 may determine whether using the feeder 41 is allowed, based on whether the communication between the configuration management device 1H and each of the component mounting machines 21 to 28 is allowed. Accordingly, the component mounting line management device 1 can cause the configuration management device 1H to unitarily manage information regarding the installation device, and can reduce occurrence of disturbance (suspension of the component mounting line 1L) due to unitary management.

Second Embodiment

Figure 11:
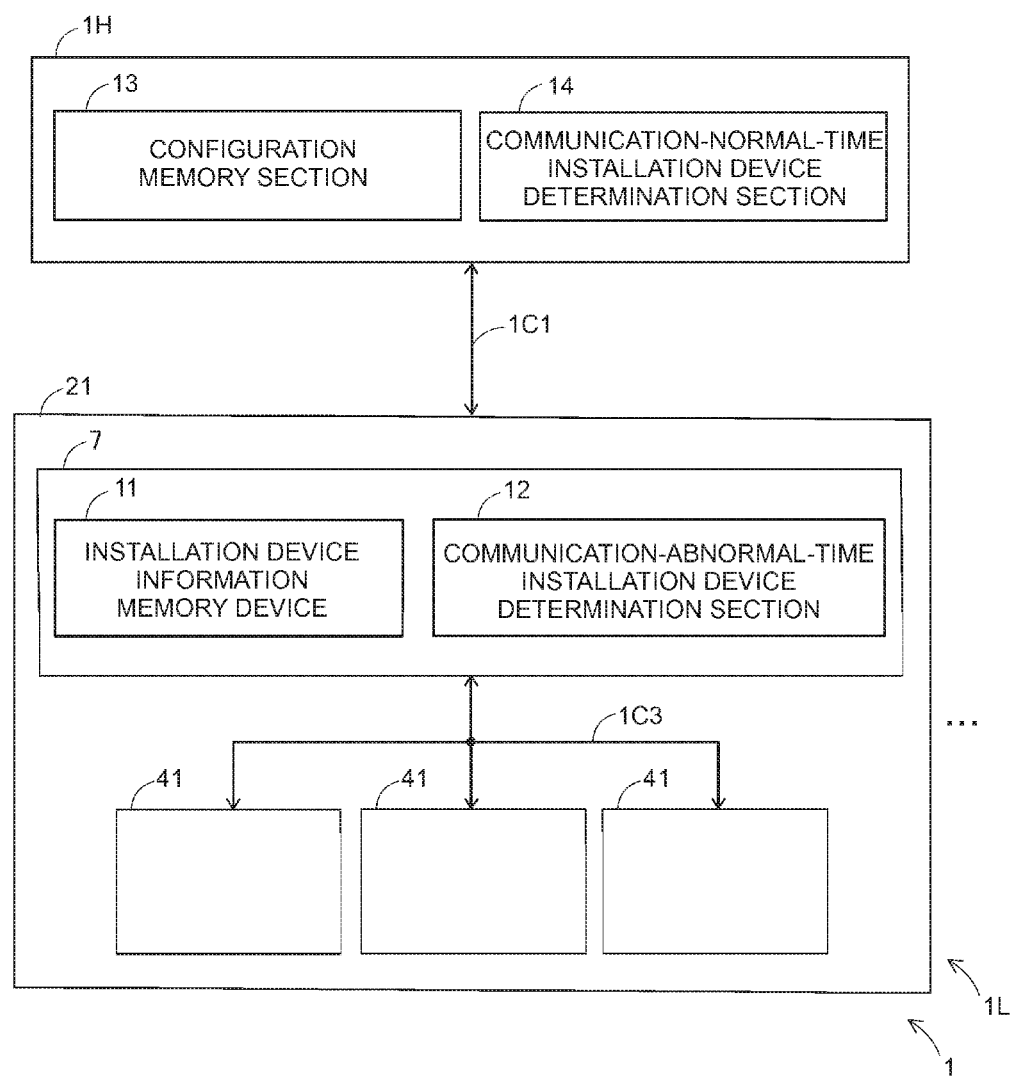
FIG. 11 is a block diagram illustrating a control block of a component mounting line management device 1 according to a second embodiment.

The second embodiment is different from the first embodiment in that the installation device information memory device 11 is provided in each of the component mounting machines 21 to 28. FIG. 11 is a block diagram illustrating an example of a control block of a component mounting line management device 1.

As illustrated in FIG. 11, the installation device information memory device 11 is provided in the control device 7. Thus, the installation device information memory device 11 is not required to be provided for each installation device, and the control device 7 may store installation device identification information and location information of an installation device in correlation with each other. For this reason, it is possible to suppress an increase of man-hours, and an increase of cost in comparison to a case where the installation device information memory device 11 is provided in each installation device. For example, the above descriptions can be also applied to an installation device such as the suction nozzle 53, which has a difficulty in providing a memory device in the installation device itself, and thus it is possible to expand an application range of an installation device.

The control device 7 of each of the component mounting machines 21 to 28 is appropriate as long as the control device 7 is connected to the terminal device 91 through a communication line which is equal to the communication line 1C2, so as to enable communication. Thus, when the communication between the configuration management device 1H and each of the component mounting machines 21 to 28 is impossible, installation device identification information and location information of each installation device are easily stored in the installation device information memory device 11, in correlation with each other.

In the embodiment, in the component mounting line management device 1, each of the component mounting machines 21 to 28 includes the installation device information memory device 11 and the communication-abnormal-time installation device determination section 12. In the embodiment, the component mounting line management device 1 may determine whether using a feeder 41 is allowed, by using feeder identification information (corresponding to the installation device identification information of the present disclosure) of the feeder 41, and location information correlated with the feeder identification information, which are stored in the installation device information memory device 11, when the communication between the configuration management device 1H and each of the component mounting machines 21 to 28 is impossible. Accordingly, the component mounting line 1L can continuously perform production even when the communication between the configuration management device 1H and each of the component mounting machines 21 to 28 is impossible, and it is possible to suppress degradation of production efficiency due to suspension of the component mounting line 1L.

<Others>

The present disclosure is not limited to only the above-described embodiments and the drawings. The present disclosure may be appropriately changed and performed in a range without departing from a gist. For example, an embodiment obtained by combining the first embodiment and the second embodiment may be used. Specifically, regarding some of installation devices (for example, feeder 41 and the like), the installation device information memory device 11 may be provided in the installation device, and regarding other installation devices (for example, suction nozzle 53 and the like), the installation device information memory device 11 may be provided in the control device 7 of each of the component mounting machines 21 to 28.

REFERENCE SIGNS LIST

1: component mounting line management device,
11: installation device information memory device,
12: communication-abnormal-time installation device determination section,
14: communication-normal-time installation device determination section,
1L: component mounting line, 1H: configuration management device, 1C1: communication line,
21 to 28: component mounting machine,
4: component supply device, 41: feeder (corresponding to installation device of the present disclosure),
5: component transfer device, 52: component mounting head (corresponding to installation device of the present disclosure), 53: suction nozzle (corresponding to installation device of the present disclosure),

The invention claimed is:

1. A component mounting line management device, comprising:
a component mounting line in which a plurality of component mounting machines are arranged, a component mounting machine of the plurality of component mounting machines mounting a component on a printed circuit board, the component mounting machine including a plurality of installation devices which are feeders detachably attached at an installation position of the component mounting machine; and
a configuration management device that is connected to each of the component mounting machines through a communication line, and stores installation device identification information and location information in correlation with each other, the installation device identification information identifying each of the plurality of installation devices and the location information indicating an installation position of the installation device in the component mounting machine,
wherein the configuration management device includes a communication-normal-time installation device determination section that receives from the component mounting machine transmission of a transmitted installation device identification information and a transmitted location information when the installation device is attached at the installation position, and that compares the transmitted installation device identification information and the transmitted location information to the installation device identification information and the location information stored in the configuration management device, so as to determine whether the installation device is used for mounting the component on the printed circuit board, wherein each of the component mounting machines includes an installation device information memory device configured to communicate with the configuration management device that also stores the installation device identification information of the installation device attached at the installation position, and the location information on the installation position in correlation with each other, wherein each of the component mounting machines includes a communication-abnormal-time installation device determination section that compares the installation device identification information of the installation device attached at the installation position and the location information on the installation position when communication with the configuration management device is impossible, to installation device identification information of the installation device and location information correlated with the installation device identification information which are stored in the installation device information memory device, so as to determine whether the installation device is used for mounting the component on the printed circuit board.

2. The component mounting line management device according to claim 1, wherein the installation device information memory device stores the installation device identification information of the installation device attached at the installation position and the location information on the installation position in correlation with each other, for each production job of the component mounting machine, and the communication-abnormal-time installation device determination section determines whether the installation device is used, by using the installation device identification information of the installation device which corresponds to a production job performed when the communication with the configuration management device is impossible and is stored in the installation device information memory device, and the location information correlated with the installation device identification information.

3. The component mounting line management device according to claim 1, wherein the installation device information memory device stores a use period of the installation device which is usable in production of the printed circuit board, in correlation with the installation device identification information, and the communication-abnormal-time installation device determination section determines that using the installation device the use period of which has elapsed is not allowed.

* * * * *